United States Patent
Yoon et al.

(10) Patent No.: US 7,031,202 B2
(45) Date of Patent: Apr. 18, 2006

(54) METHOD AND APPARATUS FOR RAPIDLY STORING DATA IN MEMORY CELL WITHOUT VOLTAGE LOSS

(75) Inventors: Seok-Cheol Yoon, Ichon-shi (KR); Jae-Jin Lee, Ichon-shi (KR)

(73) Assignee: Hynix Semiconductor Inc., (KR)

(*) Notice: Subject to any disclaimer, the term of this patent is extended or adjusted under 35 U.S.C. 154(b) by 151 days.

(21) Appl. No.: 10/744,257

(22) Filed: Dec. 22, 2003

(65) Prior Publication Data

US 2004/0240304 A1  Dec. 2, 2004

(30) Foreign Application Priority Data

May 29, 2003  (KR) .................... 10-2003-0034310

(51) Int. Cl.
*G11C 11/34* (2006.01)
(52) U.S. Cl. .................... 365/189.09; 365/207
(58) Field of Classification Search .......... 365/189.09, 365/207
See application file for complete search history.

(56) References Cited

U.S. PATENT DOCUMENTS

| | | | | |
|---|---|---|---|---|
| 5,297,104 A | * | 3/1994 | Nakashima | 365/230.06 |
| 6,058,069 A | | 5/2000 | Ting et al. | |
| 6,104,653 A | * | 8/2000 | Proebsting | 365/203 |
| 6,160,749 A | * | 12/2000 | Pinkham et al. | 365/226 |
| 6,445,610 B1 | * | 9/2002 | Porter et al. | 365/149 |
| 6,462,998 B1 | * | 10/2002 | Proebsting | 365/205 |
| 6,556,482 B1 | | 4/2003 | Shimoyama et al. | |
| 6,845,051 B1 | * | 1/2005 | Komura | 365/203 |
| 6,862,237 B1 | * | 3/2005 | Kato | 365/222 |
| 2001/0024382 A1 | | 9/2001 | Shimoyama et al. | |
| 2002/0152083 A1 | | 10/2002 | Dokic et al. | |
| 2003/0145260 A1 | | 7/2003 | Yutan et al. | |

FOREIGN PATENT DOCUMENTS

| | | |
|---|---|---|
| JP | 3-194640 | 8/1991 |
| JP | 4-69893 | 3/1992 |
| JP | 4-98686 | 3/1992 |
| JP | 6-12871 | 1/1994 |

* cited by examiner

*Primary Examiner*—M. Tran
(74) *Attorney, Agent, or Firm*—Blakely Sokoloff Taylor & Zafman

(57) ABSTRACT

The present relates to a memory device; and, more particularly, to an apparatus and a method for preventing a loss of reliability of data, which are stored in memory cell, at the time of restoring and writing the data. The semiconductor memory device according to the present invention comprises: a high voltage generator for boosting an external voltage level and then for producing a first high voltage level; a pumping control signal generator for issuing a pumping control signal, which is activated in a restore section and a write section, in response to a command signal; a pumping unit for outputting the first high voltage level from the high voltage generator or for boosting the high voltage level in order to generate a second high voltage plus level in response to the pumping control signal from the pumping control signal generator, wherein the second high voltage plus level is higher than the first high voltage level; and a word line driver for driving the word line WL using the first high voltage level and for driving the word line WL using the second high voltage plus level from the pumping unit in the restore and write sections.

22 Claims, 8 Drawing Sheets

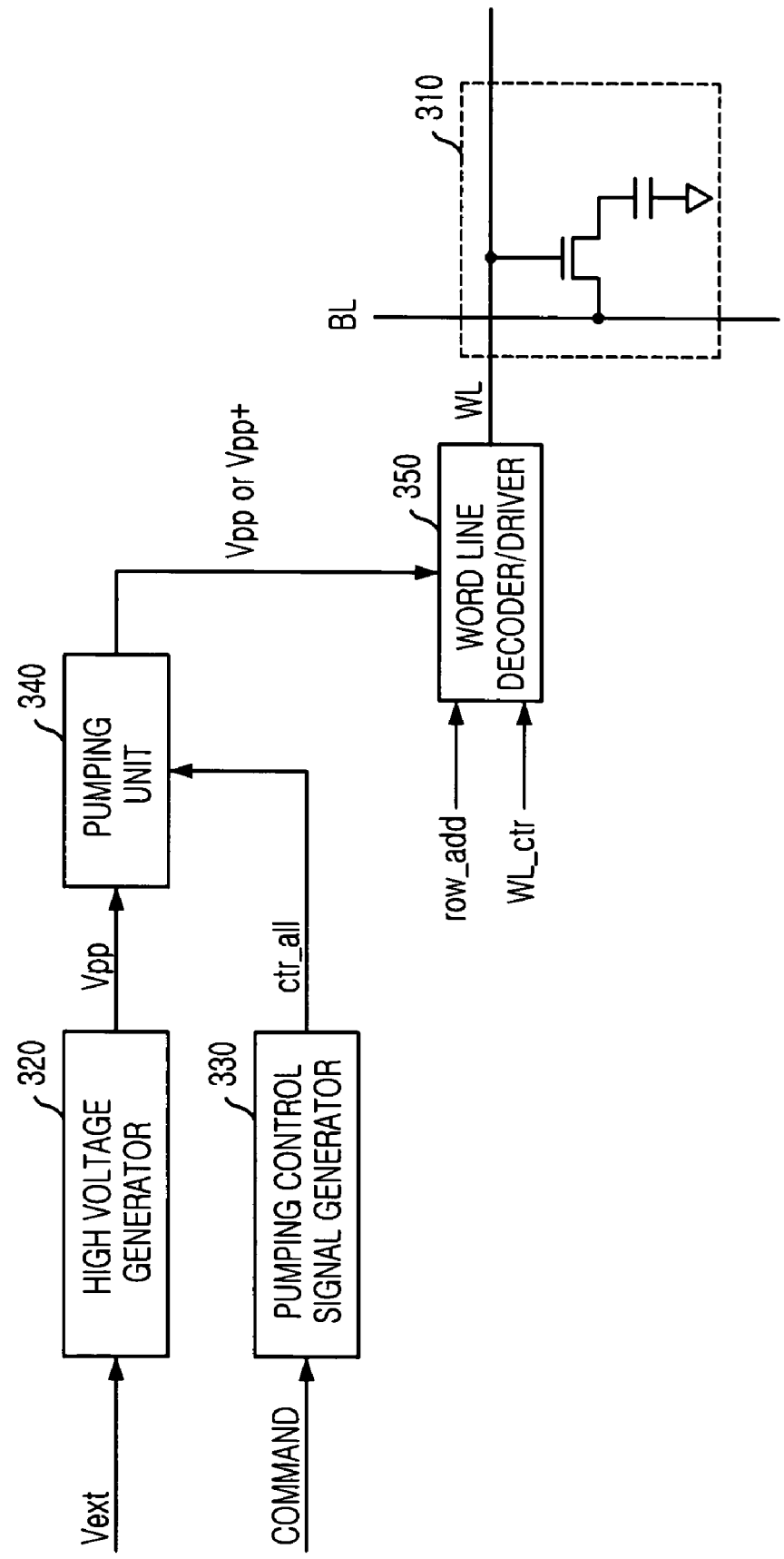

METHOD AND APPARATUS FOR RAPIDLY STORING DATA IN MEMORY CELL WITHOUT VOLTAGE LOSS

FIELD OF THE INVENTION

The present relates to a memory device; and, more particularly, to an apparatus and a method for preventing a loss of reliability of data, which are stored in memory cell, at the time of restoring and writing the data.

BACKGROUND OF THE INVENTION

Generally, in order to read out data from a memory cell, the data in the memory cell are induced on a bit line by the activation of a word line and a bit line sense amplifier is driven to amplify the induced voltage on the bit line. Thereafter, it is required to restore the amplified cell voltage on the bit line to the memory cell. When a write operation is driven in order to store data from an external circuit in a memory cell, an inverted or a non-inverted voltage of an amplified voltage on the bit line is stored in the memory cell. A memory operation section, in which this amplified voltage level on bit line is stored in the memory cell, may be one of a restore section and a write section.

Referring to FIG. 1, a memory cell 110 is coupled to both a bit line BL and a word line WL and a sense amplifier 120 is coupled to a pair of bit lines BL and /BL. The word line WL is driven by a row decoder/word line driver 140. A specific word line is activated in response to a word line control signal WL_crt, which is activated by an active command, and to a decoding signal which is produced by row address signals row_add. Since a cell access transistor is an NMOS transistor and a threshold voltage Vt is applied to the bit line when a bit line potential is transferred to the cell, the voltage loss of the threshold voltage is caused. In order to compensate for this threshold voltage loss, a high voltage level Vpp is applied to the word line and a high voltage generator 130 is provided to generate such a high voltage level Vpp which is higher than an external voltage level of the memory. A driving voltage generator 160 is enabled by enable signals rtoen and sben which are activated in a sense amplifier controller (not shown) and driving voltage signals RTO and SB are transferred to the bit line sense amplifier 120.

FIG. 2A is a waveform illustrating a restore operation in case that a logic high data (H) is stored in the cell. A high voltage level Vpp for the word line is activated by an active command (that is, row active signal rowact is activated) and a cell data is induced on the bit line BL by the charge sharing when the access transistor is turned on by the activated word line WL. Namely, the potential on the bit line BL is increased a little and that of the bit line /BL is kept in a precharge level Vdd/2. As a result, a voltage difference $\Delta V$ between the bit lines BL and /BL is caused by the data voltage stored in the cell (section A in FIG. 2A).

After a predetermined sensing margin time, if the enable signals rtoen and sben are enabled through the sense amplifier controller, the driving voltage generator 160 and the sense amplifier 120 are driven so that the fine voltage ($\Delta V$) is amplified. Accordingly, the voltage level of the bit line BL goes to the voltage level Vdd and that of the bit line /BL goes to the ground voltage level GND (section B in FIG. 2A).

Although the bit lines BL and /BL are completely amplified up to the voltage level Vdd and the ground voltage level GND, respectively, the word line WL should be continuously activated by the restore operation because these amplified voltage levels are restored in the memory cell (section C in FIG. 2A).

After the complete of restore operation, the word line is non-activated by the precharge command and the bit lines BL and /BL are precharged with the removal of the fine voltage difference (section D in FIG. 2A).

FIG. 2B is a waveform illustrating a write operation in case that a logic high data (H) is written in the memory cell.

The high voltage level Vpp for the word line is activated by an active command (that is, row active signal rowact is activated) and cell data is induced on the bit line BL by the charge sharing when the access transistor is turned on by the activated word line WL. Namely, the potential on the bit line BL is increased a little and that of the bit line /BL is kept in a precharge level Vdd/2. As a result, a voltage difference $\Delta V$ between the bit lines BL and /BL is caused by the data voltage stored in the cell (section A in FIG. 2B).

After a predetermined sensing margin time, if the enable signals rtoen and sben are enabled through the sense amplifier controller, the driving voltage generator 160 and the sense amplifier 120 are driven so that the voltage difference ($\Delta V$) is amplified. Accordingly, the voltage level of the bit line BL goes to the voltage level Vdd and that of the bit line /BL goes to the ground voltage level GND (section B in FIG. 2B).

A high voltage level "H" is applied to the bit line BL through a write driver (not shown in FIG. 1) in response to the write command so that an inversion of the high voltage level occurs on the bit lines BL and /BL and, since the word line is activated, the cell voltage is in compliance with the potential variation of the bit line (section C in FIG. 2B).

Finally, after the writing operation has been completed, the word line is non-activated by the precharge command and the bit lines BL and /BL are precharged to the same voltage level.

Referring to sections C in the FIGS. 2A and 2B in which the bit line voltage is applied to the memory cell, the cell voltage stored in the memory cell is lower than the bit line voltage so that the logic high voltage "H" stored in the memory cell is not sufficient to guarantee the reliability of the cell data. The reason why the cell voltage stored in the memory cell is lower than the bit line voltage is that the high voltage level Vpp using an external voltage Vext is relatively low and the high voltage level Vpp on the word line does not overcome the threshold voltage Vt of the access transistor. Further, with the increase of the circuit integration, this problem can be caused by the decrease of an internal operation voltage. That is, since a contact fabricating process is getting hard in the highly integrated circuit design, the size of the access transistor is getting smaller and a contact resistance is getting higher. Although the external voltage drop is not generated, the high voltage transfer cannot be normally carried out if there is a problem in the contact process. As a result, the contact problem in the fabrication process makes the cell voltage drop as the same as the external voltage drop.

As stated above, in the conventional memory device, both the contact problem in the fabrication process and the external voltage drop make the voltage drop in the memory cell. This cell voltage drop, which obstructs the reliability of the cell data, occurs irrespective of the precharge voltage level.

SUMMARY OF THE INVENTION

It is, therefore, an object of the present invention is to provide an apparatus and a method for preventing a loss of the reliability of cell data when a restore operation and a write operation are driven in the semiconductor memory device.

It is, therefore, another object of the present invention is to provide an apparatus and a method for decreasing recovery time (tWR) during a write deriving operation.

In accordance with one aspect of the present invention, there is provided a semiconductor memory device comprising: a high voltage generating means for boosting an external voltage level and then for producing a first high voltage level; a pumping control signal generating means for issuing a pumping control signal, which is activated in a restore section and a write section, in response to a command signal; a pumping unit for outputting the first high voltage level from the high voltage generating means or for boosting the high voltage level in order to generate a second high voltage plus level in response to the pumping control signal from the pumping control signal generator, wherein the second high voltage plus level is higher than the first high voltage level; and a word line driving means for driving the word line WL using the first high voltage level and for driving the word line WL using the second high voltage plus level from the pumping unit in the restore and write sections.

In accordance with another aspect of the present invention, there is provided a method for driving a semiconductor memory device comprising the steps of: activating a word line in a first high voltage level in response to an active command and inducing a fine voltage of cell data on the bit line, wherein the first high voltage level is higher than an external voltage level; amplifying the fine voltage on the bit line; activating the word line in a second high voltage level and restoring the amplified voltage on the bit line, wherein the second high voltage level is higher than the first high voltage level; and non-activating the word line in response to a precharge command and precharging the bit line.

In accordance with still another aspect of the present invention, there is provided a method for driving a semiconductor memory device comprising the steps of: activating a word line in a first high voltage level in response to an active command and inducing a fine voltage of cell data on the bit line, wherein the first high voltage level is higher than an external voltage level; amplifying the fine voltage on the bit line; activating the word line in a second high voltage level and restoring the amplified voltage on the bit line, wherein the second high voltage level is higher than the first high voltage level; and non-activating the word line in response to a precharge command and precharging the bit line.

In accordance with still another aspect of the present invention, there is provided a semiconductor memory device comprising: a driving voltage generating means for producing a driving voltage level using an external voltage level; a pumping control signal generating means for producing a pumping control signal, which is activated in a restore section and a write section, in response to a command signal; a pumping means for transferring the driving voltage level from the driving voltage generating means or for boosting the external voltage level in order to output a high voltage level which is higher than the external voltage level; and a bit line sense amplifier for receiving the external voltage level or the high voltage level from the pumping means and amplifying the bit line voltage of a selected memory cell.

In accordance with still another aspect of the present invention, there is provided a method for driving a semiconductor memory device comprising the steps of: amplifying a voltage level corresponding to a cell data, which is induced on a bit line, using an external voltage level; restoring the amplified voltage level on the bit line using a high voltage level, which is higher than the external voltage level; and non-activating the word line and precharging the bit line.

In accordance with yet another one aspect of the present invention, there is provided a method for driving a semiconductor memory device comprising the steps of: amplifying a voltage level corresponding to a cell data, which is induced on a bit line, using an external voltage level while a word line is activated by a first high voltage level; applying a voltage level corresponding to an input data to the bit line in response to a write command and writing the amplified voltage level on the bit line while a word line is activated by a second high voltage level, wherein the second high voltage level is higher than the first high voltage level; and non-activating the word line and precharging the bit line.

BRIEF DESCRIPTION OF THE DRAWINGS

The above and other objects and features of the present invention will become apparent from the following description of preferred embodiments given in conjunction with the accompanying drawings, in which:

FIG. 3 is a block diagram of a word line and a sense amplifier according to a first embodiment of the present invention;

DETAILED DESCRIPTION OF THE PREFERRED EMBODIMENTS

Figure 1:
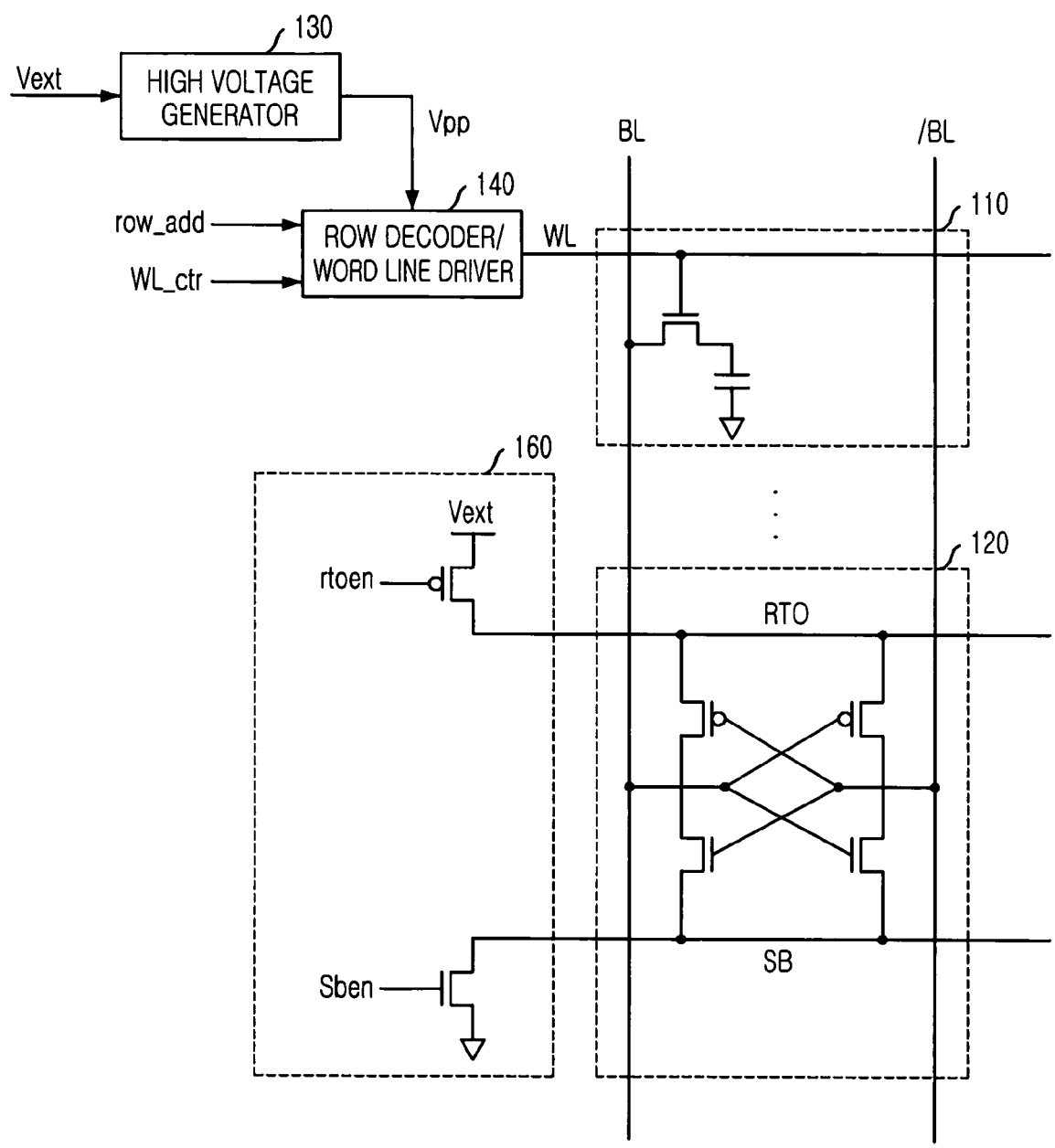
FIG. 1 is a block diagram of a conventional word line and a sense amplifier.
Figure 2A:
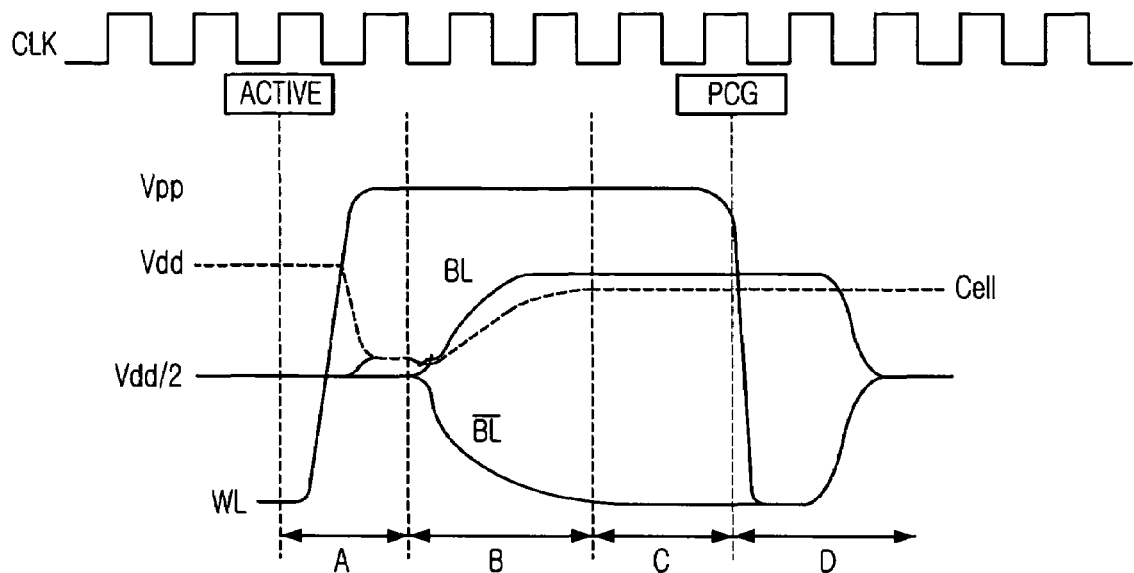
FIG. 2A is a waveform illustrating a restore operation in case that a logic high data (H) is stored in a cell in FIG. 1.
Figure 2B:
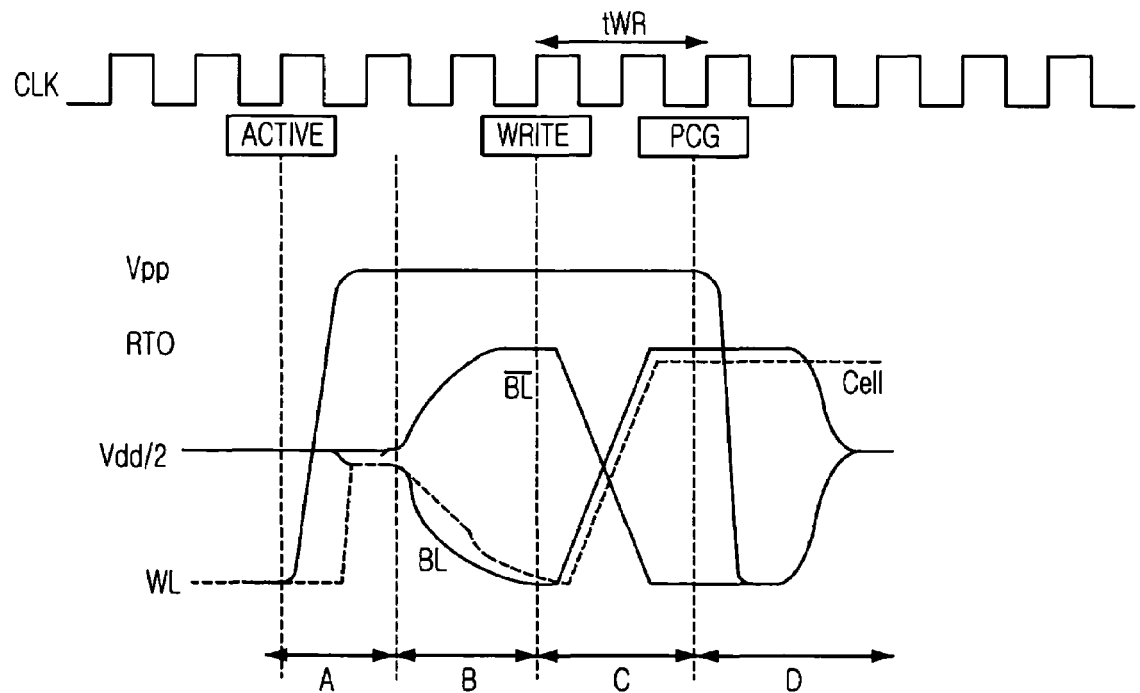
FIG. 2B is a waveform illustrating a write operation in case that a logic high data (H) is written in the memory cell in FIG. 1.

Hereinafter, with reference to the accompanying drawings, a preferred embodiment of the present invention will be explained in detail.

(First Embodiment)

Referring to FIG. 3, a memory device according to the first embodiment of the present invention includes: a memory cell 310 coupled to a word line WL and a bit line BL; a high voltage generator 320 to boost an external voltage level Vext and then to produce a high voltage level Vpp; a pumping control signal generator 330 to issue a pumping control signal ctr_all, which is activated in a restore section and a write section, in response to a command signal; a pumping unit 340 to output the high voltage level Vpp from the high voltage generator 320 or to boost the high voltage level Vpp for generating a high voltage plus level Vpp+ in response to the pumping control signal ctr_all from the pumping control signal generator 330; and a word line driver 350 (including a decoder) to drive the word line WL selected by a word line decoder using the high voltage level Vpp or the high voltage plus level Vpp+ from the pumping unit 340.

Figure 4A:
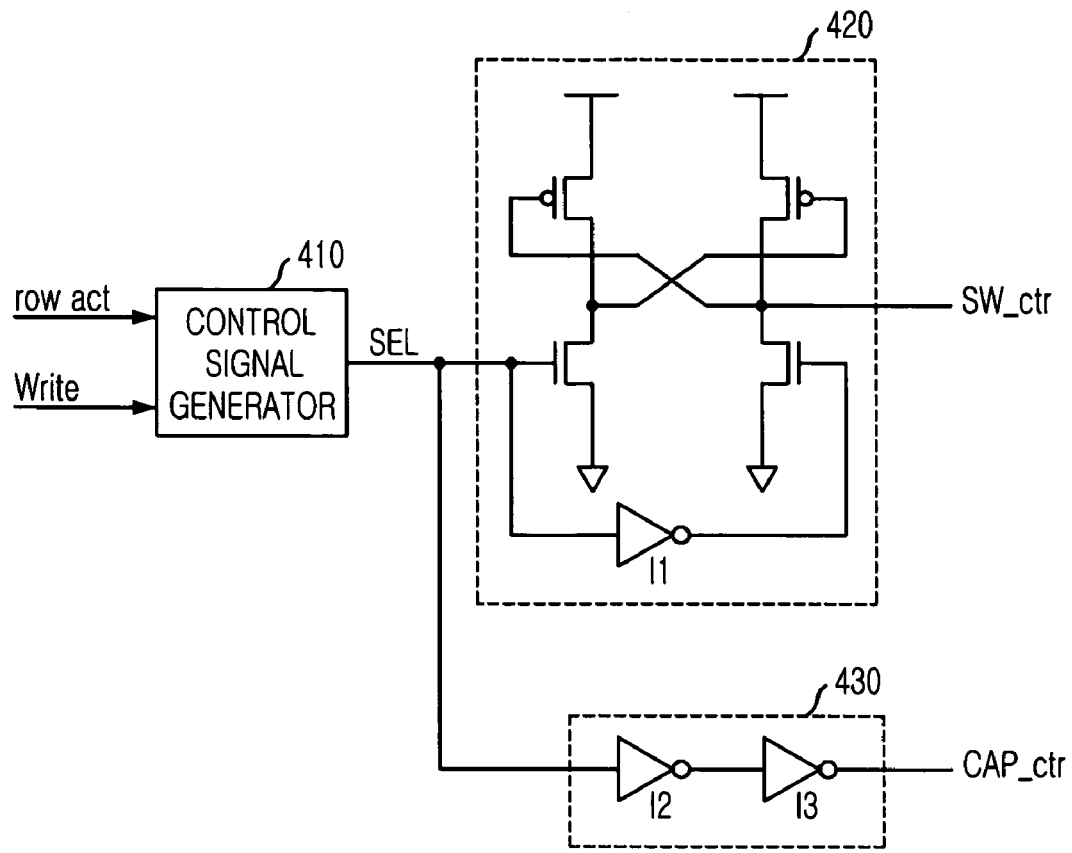
FIG. 4A is a detailed block diagram illustrating a pumping control signal generator in FIG. 3.
Figure 4B:
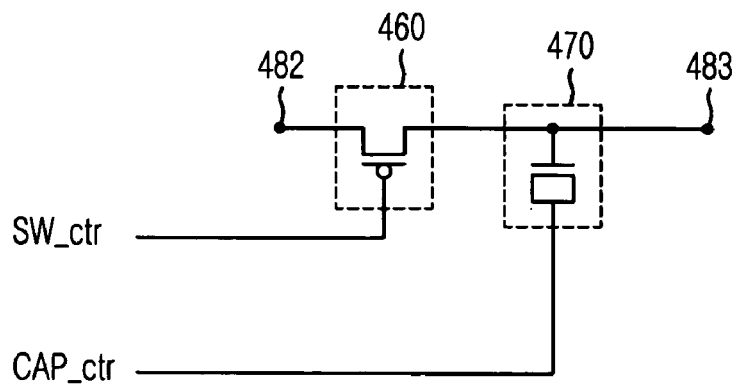
FIG. 4B is a detailed block diagram illustrating a pumping unit in FIG. 3.

FIG. 4A is a detailed block diagram illustrating the pumping control signal generator 330 in FIG. 3 and FIG. 4B is a detailed block diagram illustrating the pumping unit 340 in FIG. 3.

First, referring to FIG. 4A, the pumping control signal generator 330 includes: a control signal generator 410 to produce a control signal SEL, which are activated in the restore section and the write section, in response to command signals such as a row active signal rowact and a write signal Write; a switching control signal generator 420 to buffer the control signal SEL and then to produce a switching control signal SW_ctr; and a pumping signal generator 430 to buffer and delay the control signal SEL and then to produce a pumping signal CAP_ctr.

Referring to FIG. 4B, the pumping unit 340 includes a power supply formed between an output terminal of the high voltage generator 320 and a driving voltage terminal 483 of the word line driver 350, a switch 460 to turn on or off the power supply in the restore or write section, and a capacitor 470 to increase a first high voltage level of the switch 460 to a second high voltage level in the restore or write section.

The switch 460 includes a PMOS transistor which transfers the power supply voltage to the capacitor 470 in response to the switching control signal SW_ctr and the capacitor 470 includes an NMOS transistor which has a source and drain, which are coupled to the pumping signal CAP_ctr, and a gate receiving an output signal of the switch 460. It should be noted that the switch 460 and the capacitor 470 could be implemented by different logic circuits to carry out the same logic operation.

Figure 5A:
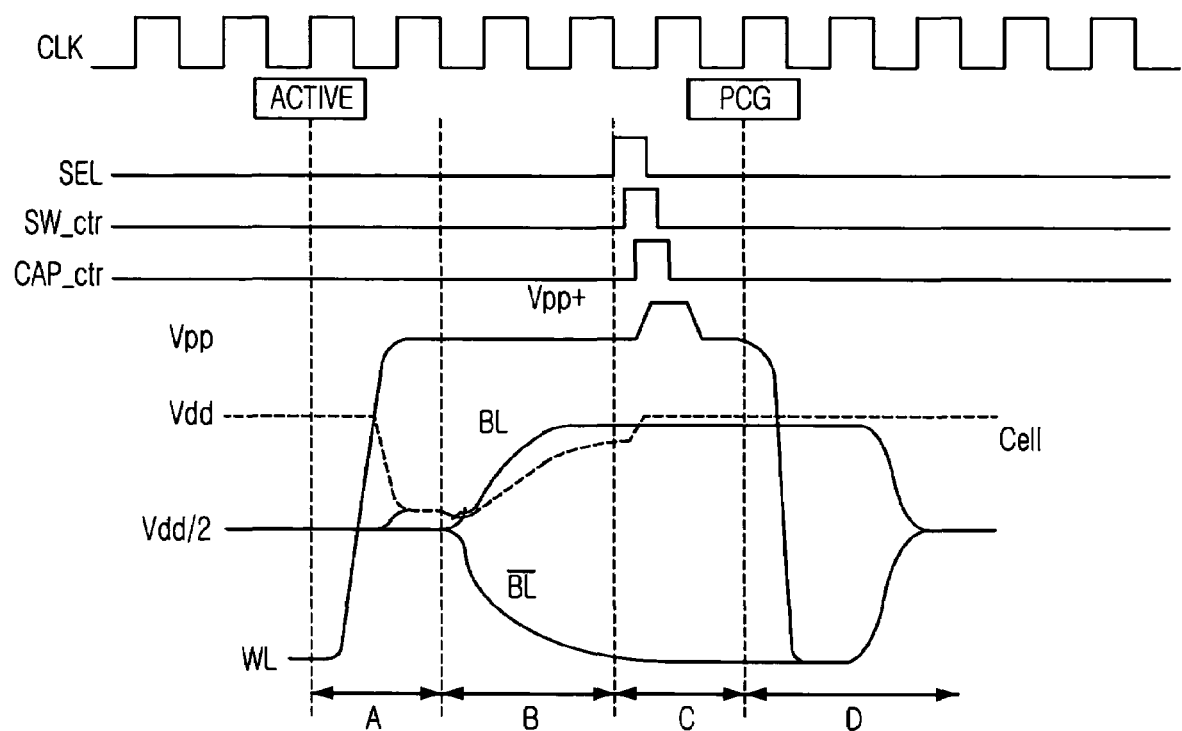
FIG. 5A is a waveform illustrating a restore operation according to the first embodiment of the present invention.

FIG. 5A is a waveform illustrating the restore operation according to the first embodiment of the present invention. A high voltage level Vpp for the word line is activated by an active command (that is, row active signal rowact is activated) and a cell data is induced on the bit line BL by the charge sharing when the access transistor is turned on by the activated word line WL. Namely, the potential on the bit line BL is increased a little and that of the bit line /BL is kept in a precharge level Vdd/2. As a result, a voltage difference between the bit lines BL and /BL is ΔV which is cause by the data voltage stored in the cell (section A in FIG. 5A).

After a predetermined sensing margin time, the bit line sense amplifier is driven so that the voltage difference (ΔV) is amplified. Accordingly, the voltage level of the bit line BL goes to the voltage level Vdd and that of the bit line /BL goes to the ground voltage level GND (section B in FIG. 5A).

Subsequently, in a state that the word line is activated, the voltage level Vdd on the amplified bit line BL is restored in the memory cell (section B in FIG. 5A). At this time, the word line WL is activated by the high voltage plus level Vpp+ which is higher than the high voltage level Vpp and which is generated by the pumping control signal generator 330 and the pumping unit 340. By applying the high voltage plus level Vpp to the word line WL, the cell voltage in the restore section is kept in a satisfactorily high reliability.

After the complete of restore operation, the word line is non-activated by the precharge command and the bit lines BL and /BL are precharged with the removal of the fine voltage difference (section D in FIG. 5A).

Figure 5B:
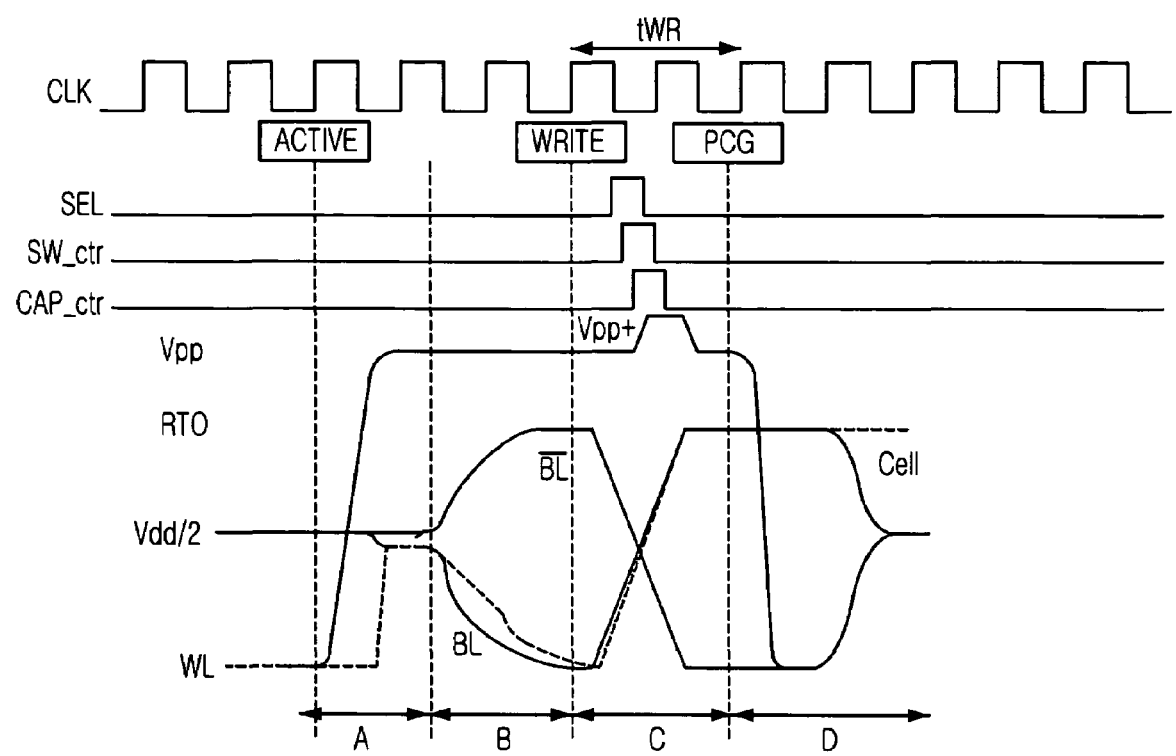
FIG. 5B is a waveform illustrating a write operation according to the first embodiment of the present invention.

FIG. 5B is a waveform illustrating a write operation according to the first embodiment of the present invention.

The high voltage level Vpp for the word line is activated by an active command (that is, row active signal rowact is activated) and a cell data is induced on the bit line BL by the charge sharing when the access transistor is turned on by the activated word line WL. Namely, the potential on the bit line BL is increased a little and that of the bit line /BL is kept in a precharge level Vdd/2. As a result, a voltage difference between the bit lines BL and /BL is ΔV which is cause by the data voltage stored in the cell (section A in FIG. 5B).

After a predetermined sensing margin time, the bit line sense amplifier is driven so that the voltage difference (ΔV) is amplified. Accordingly, the voltage level of the bit line BL goes to the voltage level Vdd and that of the bit line /BL goes to the ground voltage level GND (section B in FIG. 5B).

A high voltage level "H" is applied to the bit line BL through a write driver (not shown) in response to the write command so that an inversion of the high voltage level occurs on the bit lines BL and /BL and, since the word line is activated, the cell voltage is in compliance with the potential variation of the bit line (section C in FIG. 5B). Being different from the conventional memory device, the high voltage plus level Vpp+ is applied to the word line WL in section C. Accordingly, as shown in FIG. 5B, the cell voltage to be stored in the memory cell dose not have any data voltage loss on the bit line BL. Further, since the increase of the high voltage plus level Vpp+ applied to the word line WL makes write recovery time tWR short, the data voltage inversion can be swiftly carried out.

(Second Embodiment)

Figure 6:
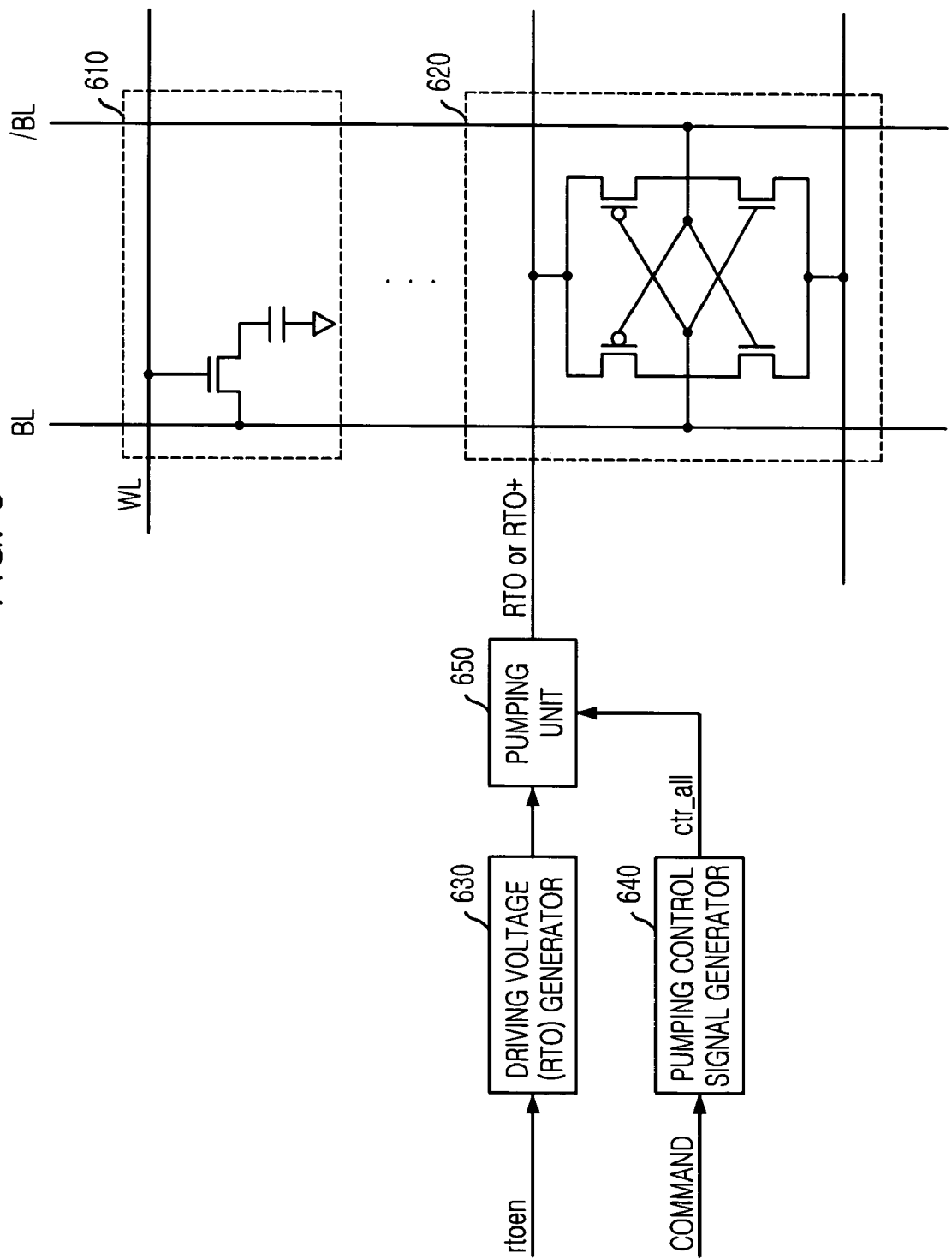
FIG. 6 is a block diagram of a word line and a sense amplifier according to a second embodiment of the present invention.

Referring to FIG. 6, a memory device according to the second embodiment of the present invention includes: a memory cell 610 coupled to a word line WL and a bit line BL; a driving voltage (RTO) generator 630 to produce a driving voltage level of a bit line sense amplifier 620 using an external voltage Vext; a pumping control signal generator 640 to issue a pumping control signal ctr_all, which is activated in a restore section and a write section, in response to a command signal; and a pumping unit 650 to transfer an output signal of the driving voltage (RTO) generator 630 to the bit line sense amplifier 620 or to generate a high voltage driving signal RTO+ in response to the pumping control signal ctr_all. The bit line sense amplifier 620 receives the voltage driving signal RTO of the external voltage level Vext or the high voltage driving signal RTO+ which is higher than the external voltage level Vext as a sense amplifier driving signal.

Since the pumping control signal generator 640 and the pumping unit 650 are the same as those illustrated in FIGS. 4A and 4B, the detailed description will be omitted.

Figure 7:
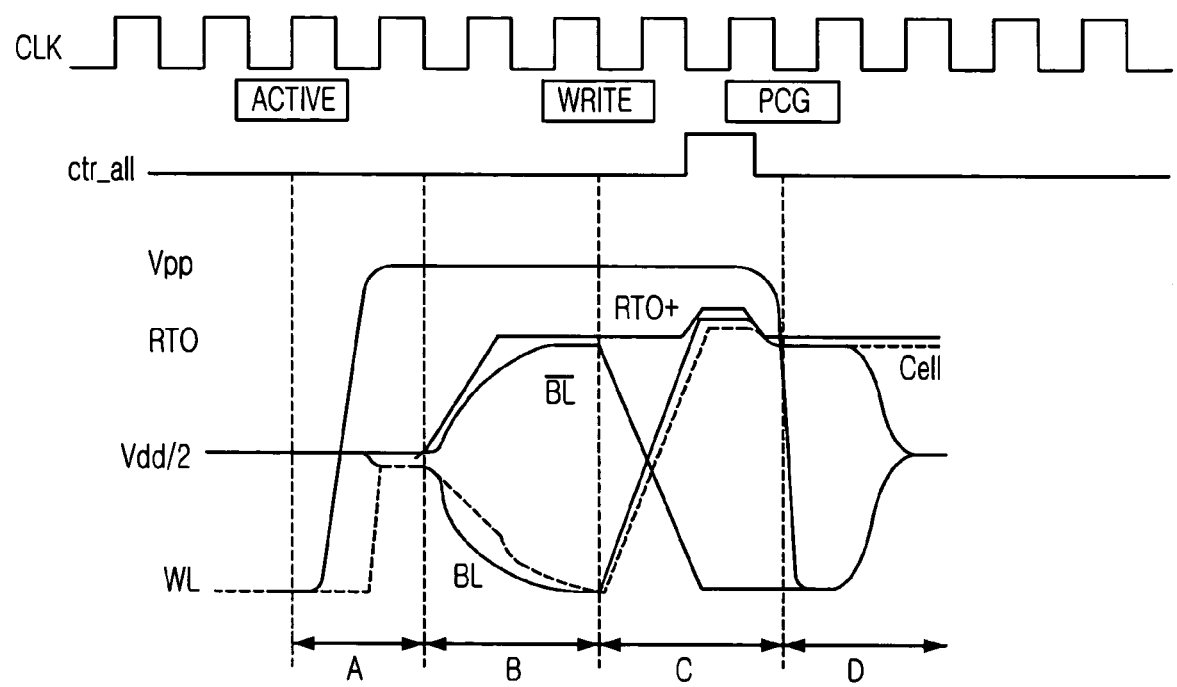
FIG. 7 is a waveform illustrating a write operation in FIG. 6.

FIG. 7 is a waveform illustrating a write operation in FIG. 6. As shown in FIG. 7, in a write recovery section (section C in FIG. 7), when the bit line sense amplifier 620 receives the high voltage driving signal RTO+ which is higher than the external voltage level Vext as a sense amplifier driving signal, the voltage level on the bit line BL is increased and a cell data voltage to be stored in the memory cell is increased according to the increase of the bit line potential, whereby the data reliability is guaranteed much more.

On the other hand, since the detailed procedures of the recovery in FIG. 7 are the same as those illustrated in FIG. 6b, the ordinary skilled in the art to which the subject pertains may easily understand the data read and write operations although the detailed description is omitted.

As illustrated above, in accordance with the present invention, the memory device can guarantee the data reliability of the restore and write recovery operation. With the reliability of data, the yield of the memory devices is increased. Furthermore, data reliability can be obtained in a narrow operating voltage of the memory devices, the yield of the memory devices is increased.

Although the preferred embodiments of the invention have been disclosed for illustrative purposes, those skilled in the art will appreciate that various modifications, additions and substitutions are possible, without departing from the scope and spirit of the invention as disclosed in the accompanying claims. In the present invention, the pumping control signal is produced by using the row active signal and a write signal; however, other signals capable of detecting the restore or write recovery section can be employed in the present invention.

What is claimed is:

1. A semiconductor memory device comprising:
   a high voltage generating means for boosting an external voltage level and then for producing a first high voltage level;
   a pumping control signal generating means for issuing a pumping control signal, which is activated in a restore section and a write section, in response to a command signal;
   a pumping unit for outputting the first high voltage level from the high voltage generating means or for boosting the high voltage level in order to generate a second high voltage plus level in response to the pumping control signal from the pumping control signal generator, wherein the second high voltage plus level is higher than the first high voltage level; and
   a word line driving means for driving the word line WL using the first high voltage level and for driving the word line WL using the second high voltage plus level from the pumping unit in the restore and write sections.

2. The semiconductor memory device as recited in claim 1, wherein the word line driving means is driven by the first high voltage level and activates the word line in the first high voltage level in memory operation sections in which memory cell data are induced on a bit line and the induced cell data are amplified and wherein the word line driving means is driven by the second high voltage level and activates the word line in the second high voltage level in a memory operation section in which memory cell data on the bit line are restored in a memory cell.

3. The semiconductor memory device as recited in claim 1, wherein the word line driving means is driven by the first high voltage level and activates the word line in the first high voltage level in memory operation sections in which memory cell data are induced on a bit line and the induced cell data are amplified and wherein the word line driving means is driven by the second high voltage level and activates the word line in the second high voltage level in a write operation section in which an external input data on the bit line are stored in a memory cell in response to a write command.

4. The semiconductor memory device as recited in claim 1, wherein the pumping unit includes:
   a power supply formed between an output terminal of the high voltage generating means and a driving voltage terminal of the word line driver;
   a switching means for turning on or off the power supply in the restore or write section; and
   a capacitor for increasing a first high voltage level of the switching means to the second high voltage level in the restore or write section.

5. The semiconductor memory device as recited in claim 4, wherein the pumping control signal generating means includes:
   a control signal generating means for producing a control signal, which are activated in a precharge section and the write section, in response to the command signal;
   a switching control signal generating means for buffering the control signal and for controlling the switching means; and
   a pumping signal generating means for buffering and delaying the control signal.

6. The semiconductor memory device as recited in claim 5, wherein the switching means includes a MOS transistor which transfers the power supply voltage in response to the switching control signal.

7. The semiconductor memory device as recited in claim 5, wherein the pumping unit includes a MOS transistor which has a source and drain, which are coupled to the pumping signal, and a gate receiving an output signal of the switching means.

8. The semiconductor memory device as recited in claim 1, wherein the switching control signal and the pumping signal are activated in the restore and write sections and wherein the switching control signal is activated before the pumping signal is activated.

9. A method for driving a semiconductor memory device comprising the steps of:
   activating a word line in a first high voltage level in response to an active command and inducing a fine voltage of cell data on the bit line, wherein the first high voltage level is higher than an external voltage level;
   amplifying the fine voltage on the bit line;
   activating the word line in a second high voltage level and restoring the amplified voltage on the bit line, wherein the second high voltage level is higher than the first high voltage level; and
   non-activating the word line in response to a precharge command and precharging the bit line.

10. The method for driving a semiconductor memory device as recited in claim 9, wherein the step of writing the voltage level on the bit line in a memory cell includes the step of inverting the amplified voltage level on the bit line.

11. A semiconductor memory device comprising:
    a driving voltage generating means for producing a driving voltage level using an external voltage level;
    a pumping control signal generating means for producing a pumping control signal, which is activated in a restore section and a write section, in response to a command signal;
    a pumping means for transferring the driving voltage level from the driving voltage generating means or for boosting the external voltage level in order to output a high voltage level which is higher than the external voltage level; and
    a bit line sense amplifier for receiving the external voltage level or the high voltage level from the pumping means and amplifying the bit line voltage of a selected memory cell.

12. The semiconductor memory device as recited in claim 11, wherein the bit line sense amplifier receives the external voltage in which memory cell data are induced on a bit line and the induced cell data are amplified and wherein the bit line sense amplifier receives the high voltage level in a memory operation section in which memory cell data on the bit line are restored in a memory cell.

13. The semiconductor memory device as recited in claim 11, wherein the bit line sense amplifier receives the external voltage level in memory operation sections in which memory cell data are induced on a bit line and the induced cell data are amplified and wherein the bit line sense amplifier receives the high voltage level in a write operation section in which an external input data on the bit line are stored in a memory cell in response to a write command.

14. The semiconductor memory device as recited in claim 11, wherein the pumping unit includes:
   a power supply formed between an output terminal of the driving voltage generating means and an driving voltage terminal of the bit line sense amplifier;
   a switching means for turning on or off the power supply in the restore or write section; and
   a pumping unit for increasing an output level of the switching means in the restore or write section.

15. The semiconductor memory device as recited in claim 14, wherein the pumping control signal generating means includes:
   a control signal generating means for producing a control signal, which are activated in a precharge section and the write section, in response to the command signal;
   a switching control signal generating means for buffering the control signal and for controlling the switching means; and
   a pumping signal generating means for buffering and delaying the control signal.

16. The semiconductor memory device as recited in claim 15, wherein the switching means includes a MOS transistor which transfers the power supply voltage in response to the switching control signal.

17. The semiconductor memory device as recited in claim 15, wherein the pumping unit includes a NMOS transistor which has a source and drain, which are coupled to the pumping signal, and a gate receiving an output signal of the switching means.

18. The semiconductor memory device as recited in claim 15, wherein the switching control signal and the pumping signal are activated in the restore and write sections and wherein the switching control signal is activated before the pumping signal is activated.

19. A method for driving a semiconductor memory device comprising the steps of:
   amplifying a voltage level corresponding to a cell data, which is induced on a bit line, using an external voltage level;
   restoring the amplified voltage level on the bit line using a high voltage level in response to a write recovery operation, which is higher than the external voltage level; and
   non-activating the word line and precharging the bit line.

20. A method for driving a semiconductor memory device comprising the steps of:
   amplifying a voltage level corresponding to a cell data, which is induced on a bit line, using an external voltage level while a word line is activated by a first high voltage level;
   applying a voltage level corresponding to an input data to the bit line in response to a write command;
   writing the amplified voltage level on the bit line while a word line is activated by a second high voltage level, wherein the second high voltage level is higher than the first high voltage level; and
   non-activating the word line and precharging the bit line.

21. The method for driving a semiconductor memory device as recited in claim 20, wherein the step of writing the voltage level on the bit line in a memory cell includes the step of inverting the amplified voltage level on the bit line.

22. The method for driving a semiconductor memory device as recited in claim 19, further comprising:
   inversing the amplified voltage level on the bit line using the high voltage level in order to correspond to an input data in response to a write command.

* * * * *